United States Patent [19]

Abraham et al.

[11] 3,907,620

[45] Sept. 23, 1975

[54] A PROCESS OF FORMING METALLIZATION STRUCTURES ON SEMICONDUCTOR DEVICES

[75] Inventors: Howard E. Abraham, Loveland, Colo.; George E. Bodway, San Jose; Weldon H. Jackson, Sunnyvale, both of Calif.

[73] Assignee: Hewlett-Packard Company, Palo Alto, Calif.

[22] Filed: Apr. 18, 1974

[21] Appl. No.: 461,812

Related U.S. Application Data

[62] Division of Ser. No. 374,230, June 27, 1973, Pat. No. 3,877,063.

[52] U.S. Cl. ...................... 156/11; 156/13; 156/17; 427/82; 427/88; 427/91

[51] Int. Cl.$^2$................ H01L 21/312; H01L 21/318

[58] Field of Search ........ 156/13, 11, 17; 204/32 R, 204/38 R, 38 S, 192; 117/215, 217, 227, 229; 357/68, 71

[56] References Cited

UNITED STATES PATENTS

| | | | |
|---|---|---|---|
| 3,406,043 | 10/1968 | Balde | 156/18 |
| 3,591,413 | 7/1971 | Seki et al. | 117/217 |
| 3,649,392 | 3/1972 | Schneck | 156/17 |
| 3,700,445 | 10/1972 | Crosen | 156/17 |
| 3,805,210 | 4/1974 | Croset et al. | 156/17 |

*Primary Examiner*—Charles E. Van Horn
*Assistant Examiner*—Jerome W. Massie
*Attorney, Agent, or Firm*—Ronald E. Grubman

[57] ABSTRACT

A semiconductor device comprising a resistor formed by a region of a layer of tantalum nitride ($Ta_2N$), said tantalum nitride layer also serving at another region as an adhesion layer and a barrier diffusion layer for the gold contacts and interconnects of the semiconductor device. A layer of tantalum nitride is also employed to form a mask for the metallization layer of a semiconductor device, the metallization layer thereafter being etched by sputter etching to produce very fine line electrical patterns for the integrated circuit.

2 Claims, 5 Drawing Figures

A PROCESS OF FORMING METALLIZATION STRUCTURES ON SEMICONDUCTOR DEVICES

This is a division of application Ser. No. 374,230, filed June 27, 1973 now U.S. Pat. No. 3,877,063.

BACKGROUND OF THE INVENTION

In the fabrication of multiple emitter transistors using planar technology, resistors are formed on the surface of the substrate and in series with each emitter to prevent the occurrence of the phenomenon of "current hogging". Thus as multiplicity of emitters, e.g. as high as 35 to 50, are formed by diffusion in the common base region of a silicon transistor, and certain ones of these emitters are coupled together by the surface metallization which forms the emitter contacts, and also the surface interconnect. With the common interconnect, the emitters are connected together in a parallel circuit fashion and the current to the parallel emitters is meant to divide equally among the parallel emitter circuits.

However, the emission of charge from an emitter and into the adjacent base region is a function of several factors, including temperature. Because of such known factors, there is a tendency for one of the emitter regions to draw more current than the other parallel emitters, and the emitter-base junction for this one region gets hot. The heat at this spot results in drawing more current, called current hogging, and a runaway process takes place which results in the destruction of the transistor.

One common technique for preventing such current hogging is to form separate resistors in series with each separate emitter, and it is now common practice to form these resistors with such metals as chromium, metal silicides, nichrome, and tantalum nitride ($Ta_2N$). After the formation of such resistors, it is then the practice to form the contacts and circuit interconnections by the process of forming a layer of good electrical conducting metal such as aluminum or gold over the transistor surface, and thereafter forming the metallization pattern by a photoresist and etch process.

In the case of aluminum, this metal is not only a good electrical conductor but it adhers well to the silicon surface. However, although gold is a superior electrical conductor, it does not adhere well to silicon. In addition, when heated, gold will diffuse into the silicon material at a high rate and will destroy the device. Therefore, when using gold for the electrical contacts and interconnects, an adhesion layer and a diffusion barrier to the gold is employed in the metallization process. For example, in one known metallization process, a layer of titanium is first placed down on the silicon surface to form a good adhesive layer, followed by a layer of platinum to serve as a diffusion barrier to the gold, followed by the layer of gold. Molybdenum performs well as an adhesion layer and is an excellent diffusion barrier while tungsten is an excellent adhesive and a fair diffusion barrier.

Therefore, when fabricating multiple emitter planar transistors, separate metallization depositions take place for the resistor material and the contact-interconnect material, as well as one or two additional materials for the adhesion and gold diffusion barrier layers.

It would be most desirable to provide a single metallization for use with the gold contacts and interconnects which would serve as the resistor material, the adhesion material, and the gold diffusion barrier material.

Additionally, in forming present day integrated circuits, very fine geometric patterns and circuit delineation is necessary and such fine definition is very difficult to accomplish with the typical forms of wet etching employed following the photoresist masking. Sputter etching as described, for example, in an article entitled "RF Sputter Etching-A Universal Etch" by P. D. Davidse, Journal of Electrochemical Society, Volume 116, January 1969, pages 100–103, will provide a very finely defined geometry, especially useful when employed with materials which require strong etchants to remove.

SUMMARY OF THE PRESENT INVENTION

The present invention provides a transistor structure in which a layer of tantalum nitride ($Ta_2N$) is used in the formation of discrete resistors as well as serving as the adhesive layer and the diffusion barrier layer for gold contacts and interconnects on the transistor.

A tantalum nitride layer is also utilized in the formation of a mask for the subsequent sputter etch of the gold and tantalum nitride layer used for the resistors, such sputter etch acting to clear the field while at the same time producing the very fine line electrical patterns desired in state-of-the-art high frequency devices and integrated circuits.

DESCRIPTION OF THE PREFERRED EMBODIMENT

Figure 1:
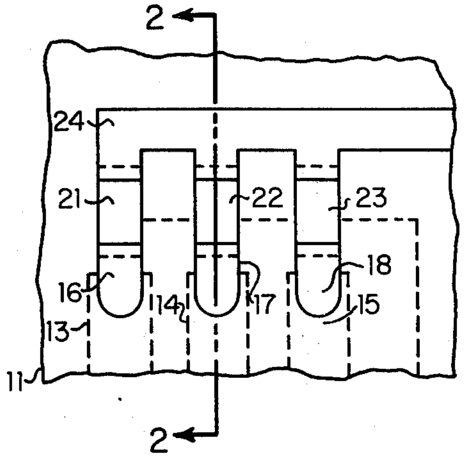
FIG. 1 is a plan view of a portion of a typical form of a multiple emitter transistor which may utilize the present invention.
Figure 2:
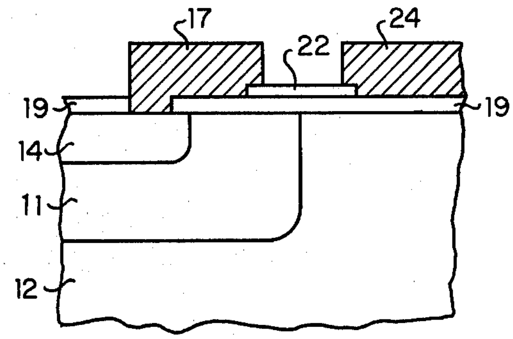
Figure 2 (PRIOR ART)
FIG. 2 is a cross-sectional view of a transistor of the form shown in FIG. 1 and taken along section line 2—2 therein utilizing a known resistor structure.

Referring now to FIGS. 1 and 2, there is shown a top view and a cross-sectional view, respectively, of a portion of a multi-emitter transistor showing a silicon body having a common base region 11 diffused into a common collector region 12, and three separate emitter regions 13, 14, and 15 diffused into the common base region 11. Emitter contacts 16, 17 and 18 are formed by known metallization techniques and contact the associated emitter areas 13, 14 and 15, respectively, through suitable openings made in the dielectric layer 19. Resistors 21, 22 and 23 are formed on top of the dielectric layer 19 for electrical connection at one of the ends thereof with the associated contacts 16, 17 and 18, respectively.

At their opposite ends, the resistors 21, 22 and 23 are electrically connected with a common interconnect 24 which is formed while the emitter contacts 16, 17 and 18 are being formed.

In accordance with the known prior art, resistors 21, 22 and 23 may be formed of chromium, metal silicides, nichrome, or tantalum nitride ($Ta_2N$), for example. The electrical contacts 16, 17 and 18 and the interconnect 24 may be formed of aluminum or gold, for example, both being good electrical conductors. In the case of aluminum, it may be applied directly to the surfaces of the dielectric layer 19, the emitters 13, 14 and 15, and the resistors 21, 22 and 23 due to its good adhesion properties and also because it diffuses slowly at the normal operating temperature of the transistors.

In the case of gold (Au) contacts and interconnects, however, gold does not adhere well and also diffuses at a high rate into the silicon body when heated. Therefore, when using gold contacts and interconnects, an adhesion layer and gold diffusion barrier must be formed between the gold and the silicon body. A suitable layer or layers (not shown) of titanium and platinum in one case, or molybdenum in a second case, or tungsten as a third example, is formed on the silicon body as a preparatory layer for the subsequent gold metallization interconnects and emitter contacts. Thus, in forming the resistors 21, 22 and 23 as well as the gold contacts and interconnects, at least three and sometimes four separate metallizations are needed, for example, $Ta_2N$ for the resistors and then titanium for the adhesive, platinum for the diffusion barrier, and gold for the contacts and interconnects.

Figure 3:
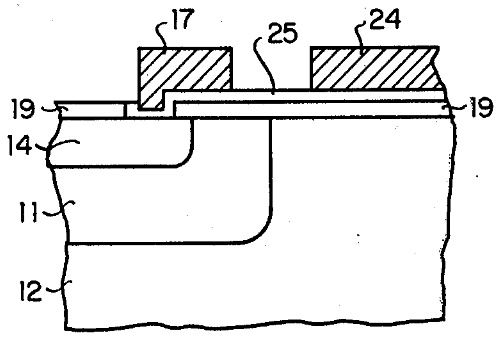
FIG. 3 is a cross-sectional view of a transistor of the type shown in FIG. 2 and taken along the same section line as FIG. 2 but showing the resistor structure of the present invention.

In accordance with the present invention, tantalum nitride ($Ta_2N$) is employed as a single layer 25 under the gold metallization 17, 24 to serve (1) as a contact area between the gold contacts and the contacted areas, e.g. the emitter contacts 17, (2) as an adhesive layer for good adhesion between the gold and the silicon surface, (3) as a diffusion barrier between the silicon body and the gold, and (4) to form the separate resistor elements, e.g. 21, 22 and 23, where needed. This $Ta_2N$ layer 25 is shown in cross-section in FIG. 3.

By utilizing this novel technique, only two metallization layers are needed, i.e. a thin $Ta_2N$ layer and a thicker gold layer. The gold electrical contacts and interconnects as well as the desired circuit resistors such as resistors 21, 22 and 23 are then formed by well known photoresist masking and subsequent metal removal techniques as well as by the novel technique described below where fine line geometry is needed in the formation of the high frequency devices and integrated circuits.

Figure 4:
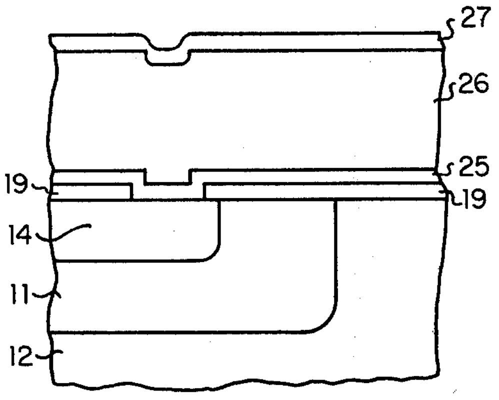
FIG. 4 is a cross-sectional view of a transistor structure of the type shown in FIG. 3 after the step of metallization in accordance with the present invention and prior to the step of metal removal to form the desired pattern of metal contacts and interconnects.
Figure 5:
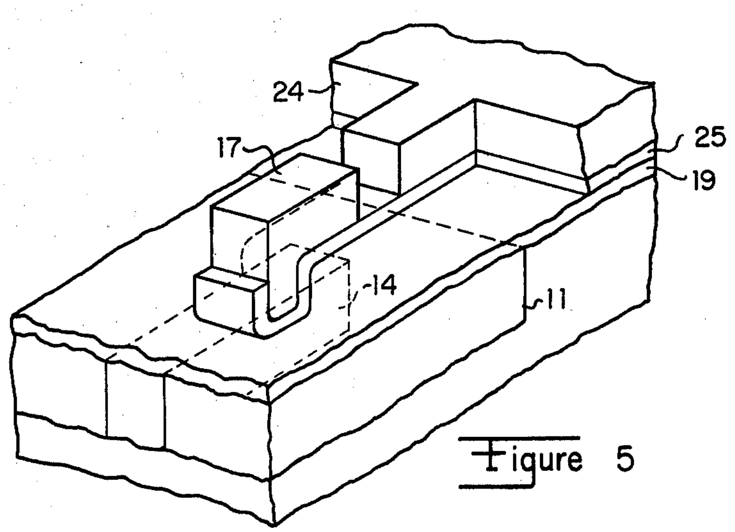
FIG. 5 is a perspective view of the transistor structure of FIG. 4 after "clearing the field" by sputter etching and subsequent etching to remove the gold over the resistor area.

One novel technique for forming the resistors and the gold contacts and interconnects will be described with reference to FIGS. 4 and 5. After the formation of the emitter areas 13, 14, 15, etc. and the emitter contact openings in the dielectric layer 19, a layer 25 of $Ta_2N$ is formed over the entire surface by a typical metallization process such as evaporation or sputtering, followed by a layer 26 of gold. Then a second layer 27 of $Ta_2N$ is formed over the entire gold surface area. There is thus formed a sandwich of $Ta_2N$, gold, and $Ta_2N$. In this particular illustration, the $Ta_2N$ layer 19 is about 1000 A thick, the gold layer 26 is about 8000 A, and the outer $Ta_2N$ layer is about 2600 A thick.

By known photoresist techniques, a mask is formed on the upper surface of the $Ta_2N$ layer 27 which exposes all those areas of the layer 27 that are not in alignment with the resistor areas such as area 21, 22 and 23 and with the areas of the contacts such as 16, 17 and 18 and the interconnect 24; this exposed area is referred to as the field. The surface is then subjected to a wet chemical etch to remove the top layer of the exposed $Ta_2N$ over the field until the gold is exposed in those areas. The surface is then exposed to the RF sputter etching to remove the outer layer 27 of $Ta_2N$ over the emitter finger areas and the interconnect and to also remove the exposed gold and the under layer 25 of $Ta_2N$ to clear the field. This RF sputter etching provides very clean lines so that the emitter fingers including the resistor area are clearly defined. After this RF sputter etching, the only areas to be thereafter removed is the gold layer over the resistors and this is accomplished with a photoresist masking followed by a wet etching of this gold layer in those resistor areas.

If the initial pattern formed in the upper layer 27 of $Ta_2N$ by the wet etching is not clean or is otherwise improper, the remainder of the layer 27 may be stripped off and a new $Ta_2N$ layer 27 applied for use in forming a mask with the desired characteristics.

We claim:

1. A method of fabricating semiconductor devices comprising the steps of forming a lower layer of $Ta_2N$ on a semiconductor body, forming a metallized layer over the lower layer of $Ta_2N$, forming an upper layer of $Ta_2N$ over the metallized layer, forming a mask on the upper surface of the upper $Ta_2N$ layer, chemically etching the upper $Ta_2N$ layer to expose portions of the metallized layer, sputter etching the upper $Ta_2N$ layer and the exposed portions of the metallized layer to simultaneously remove the upper $Ta_2N$ layer, the exposed portions of the metallized layer, and the portions of the lower $Ta_2N$ layer beneath the exposed portions of the metallized layer.

2. A method of fabricating semiconductor devices as in claim 1 including the further step of etching away areas of the metallized layer to expose associated areas of the lower $Ta_2N$ layer to serve as resistors for the semiconductor device.

* * * * *

UNITED STATES PATENT AND TRADEMARK OFFICE
CERTIFICATE OF CORRECTION

PATENT NO. : 3,907,620

DATED : September 23, 1975

INVENTOR(S) : Howard E. Abraham, et al.

It is certified that error appears in the above-identified patent and that said Letters Patent are hereby corrected as shown below:

The title should read -- PROCESS FOR MANUFACTURE OF SEMICONDUCTOR DEVICES --;

Column 4 line 41, after "a" insert -- photoresist --;

Column 4, line 42, after "layer" but before the comma, insert -- to expose selective portions of the upper $Ta_2N$ layer --;

Column 4, line 43, after "the" (first occurrence) insert -- exposed portions of the --;

Column 4, line 44, after "the" insert -- photoresist mask, the --; and after "$Ta_2N$ layer" insert a comma;

Column 4, line 46, after "remove" insert -- the photoresist mask, --;

Column 4, line 52, after "away" insert -- selected --;

Column 4, line 53, after "layer" insert -- overlying the lower $Ta_2N$ layer --.

Signed and Sealed this

*sixteenth* Day of *December 1975*

[SEAL]

*Attest:*

RUTH C. MASON
*Attesting Officer*

C. MARSHALL DANN
*Commissioner of Patents and Trademarks*

UNITED STATES PATENT AND TRADEMARK OFFICE
CERTIFICATE OF CORRECTION

PATENT NO. : 3,907,620

DATED : September 23, 1975

INVENTOR(S) : Howard E. Abraham, et al.

It is certified that error appears in the above-identified patent and that said Letters Patent are hereby corrected as shown below:

On the title page, in the list of inventors, please include the name and address of --

Sanehiko Kakihana, Los Altos, California -- which was inadvertently omitted from the issued patent.

Signed and Sealed this

*twenty-fifth* Day of *May 1976*

[SEAL]

*Attest:*

RUTH C. MASON
*Attesting Officer*

C. MARSHALL DANN
*Commissioner of Patents and Trademarks*